United States Patent [19]
McKiel, Jr.

[11] Patent Number: 4,707,579
[45] Date of Patent: Nov. 17, 1987

[54] REAL-TIME TAIL LENGTH MONITOR FOR WIRE BONDING FLAME-OFF APPARATUS

[75] Inventor: Frank A. McKiel, Jr., Dallas, Tex.

[73] Assignee: Rockwell International Corporation, El Segundo, Calif.

[21] Appl. No.: 18,258

[22] Filed: Feb. 24, 1987

[51] Int. Cl.[4] ............................................. B23K 11/22
[52] U.S. Cl. ............................. 219/56.22; 219/56.21; 219/130.01
[58] Field of Search .............. 219/56.21, 56.22, 130.01

[56] References Cited

U.S. PATENT DOCUMENTS 4,390,771  6/1983  Kurtz et al. ...................... 219/56.22

Primary Examiner—Clifford C. Shaw
Attorney, Agent, or Firm—Bruce C. Lutz; V. L. Sewell; H. Fredrick Hamann

[57] ABSTRACT

Circuitry for measuring the time between commencement of a flame-off arc and either the contact of the ball with the capillary tip during the flame-off process or the arc flame-off time as determined by a timer. Such information as to the length of time to contact is usable in troubleshooting quality control problems in the wire bonding process. By comparing the information presently obtained with past time checks, an alarm can be provided for significant deviations.

6 Claims, 3 Drawing Figures

REAL-TIME TAIL LENGTH MONITOR FOR WIRE BONDING FLAME-OFF APPARATUS

THE INVENTION

The present invention is generally concerned with wire bonding techniques and more specifically with thermocompression, thermosonic and ultrasonic bonding and even more specifically, with monitoring the quality of bonds by checking both (1) the time between application of a flame-off arc voltage and its termination and, (2) the time between application of a flame-off arc voltage and contact of a formed ball with the capillary tip used to hold the wire.

The present invention is related to my co-pending application, Ser. No. 6-934,042, filed 11/24/86, and assigned to the same assignee as the present invention.

BACKGROUND

Wire bonding is defined herein as the process of interconnecting points in an electronic circuit using bare, small diameter wires or ribbons which are usually made of gold or aluminum. The installed wire lengths are attached at either end by temporary contact with a tool which provides a combination of force and/or heat and/or ultrasonic energy to effect a weld of the wire to the bond surface or termination means. Wire bonds are generally divided into two main categories of wedge-wedge and ball-wedge. A wedge bond or termination results from forces applied perpendicular to a long axis of a wire to "pinch" it against the surface being bonded or the bond surface. In contrast, a ball bond is formed by first having a length of wire protruding from a small hole in the tip of a conical tool or "capillary". This wire length, known as the "tail", is then melted into a ball that is, of course, larger than the original wire diameter. In order to attach this mass to a bonding surface, the tool tip engages the periphery of the ball and applies the bond forces along the same axis as the length of the wire.

A ball-wedge bonder uses a sequence of forming a ball, attaching the ball, trailing wire from the ball through the hole in the capillary to form the wire's length and shape in the circuit. The other end is attached by using the rounded face surrounding the hole or capillary of the very same tool to then pinch the wire, thereby forming a wedge bond.

In ball-wedge bonding, two techniques are prevalent for melting the length of wire extending from the capillary tip. In each case the process is referred to as "flame-off". One approach or technique is to use a hydrogen torch and the other is called electronic flame-off. The electronic flame-off technique uses an electrode which approaches the wire and discharges a high voltage arc to melt the wire into a ball. The duration and intensity of the arc are usually controllable parameters set to values which accomplish sufficient melting of the wire to form an appropriate size ball.

Additional information relative the above background may be found in U.S. Pat. Nos. 3,006,067 and 3,087,239.

A nominal set of values in a flame-off of a one mil diameter gold wire requires about two milliseconds at a current of four milliamps to form a ball 2.5 times the wire diameter. In such a situation, the high voltage arcing source may initially provide voltages up to 2,000 volts, but the arc, once established, maintains a voltage drop of about 400 to 500 volts. This drop in voltage is monitored by most electronic flame-off systems to flag improper flame-offs due to the wire being absent from the capillary (an open circuit condition) or being too long (and thus causing a short circuit). The error signal often causes an audible warning in a manual bonder or halts the operation of an automatic bonder.

As the melted ball draws against the capillary during flame-off, the heat is dissipated rapidly into the capillary tip and the ball melts no further. Any further application of the high voltage arc accomplishes nothing but metal sputtering and carbonizing from the ambient air. The disadvantage to allowing further arcing is the adverse effects related to a coating of the wire material on the capillary tool.

In the prior art, there have been two approaches to controlling ball size. In the tail length limited mode, the amount of wire protruding from the capillary is carefully controlled by some mechanical means, and then an excess of arc energy is provided to guarantee that all the protruding wire is consumed. Although this produces reduced tool life due to thermal shock, there is accurate ball size control and the ball nests and conforms to the tool tip and is well centered to allow accurate targeting of the bond.

The other approach is an energy limited mode, wherein the electronic flame-off duration and current is controlled to act on an excess length of wire. In this case, the melt does not contact the capillary tip of the tool and no thermal shock is introduced, so tool life is prolonged. However, the ball may occasionally fail to center under the tool properly during bonding, and thus increases the likelihood of an improper bond in the next bonding operation.

It will be apparent to those skilled in the art that the length of the tail extending from the capillary at the time of commencement of the arc will affect the ball size. Accordingly, the ball size needs to be held consistent so that the force, time or ultrasonic intensity applied to the subsequent ball bond will provide proper adhesion and prevent overlap of the ball onto adjacent conductive areas.

The referenced co-pending application involves detecting the occurrence of contact of the ball with the capillary tip and terminating the arc voltage. The present invention, on the other hand, measures in the alternative, the time between application of the arc and the contact of the ball or the duration of the arc, as applied by a timer, to provide a monitor of tail length. If tail length varies substantially, quality of the ball bonding process is likely to be inconsistent. Further, the tail length is an important factor in setting up the referenced values of force, time and ultrasonic intensity. Thus, the monitoring capability of the present invention is useful, not only in setting up the initial variables to commence the ball bonding operation, but also to make sure that alterations in the process occurring during the manufacturing stage do not deviate enough to substantially affect quality of the finished product.

It is accordingly an object of the present invention to provide apparatus for monitoring the tail length of the wire used to form the ball in a ball bonder.

Other objects and advantages of the present invention will be apparent from reading the specification and appended claims in conjunction with the drawings wherein:

Detailed Description

Figure 1:
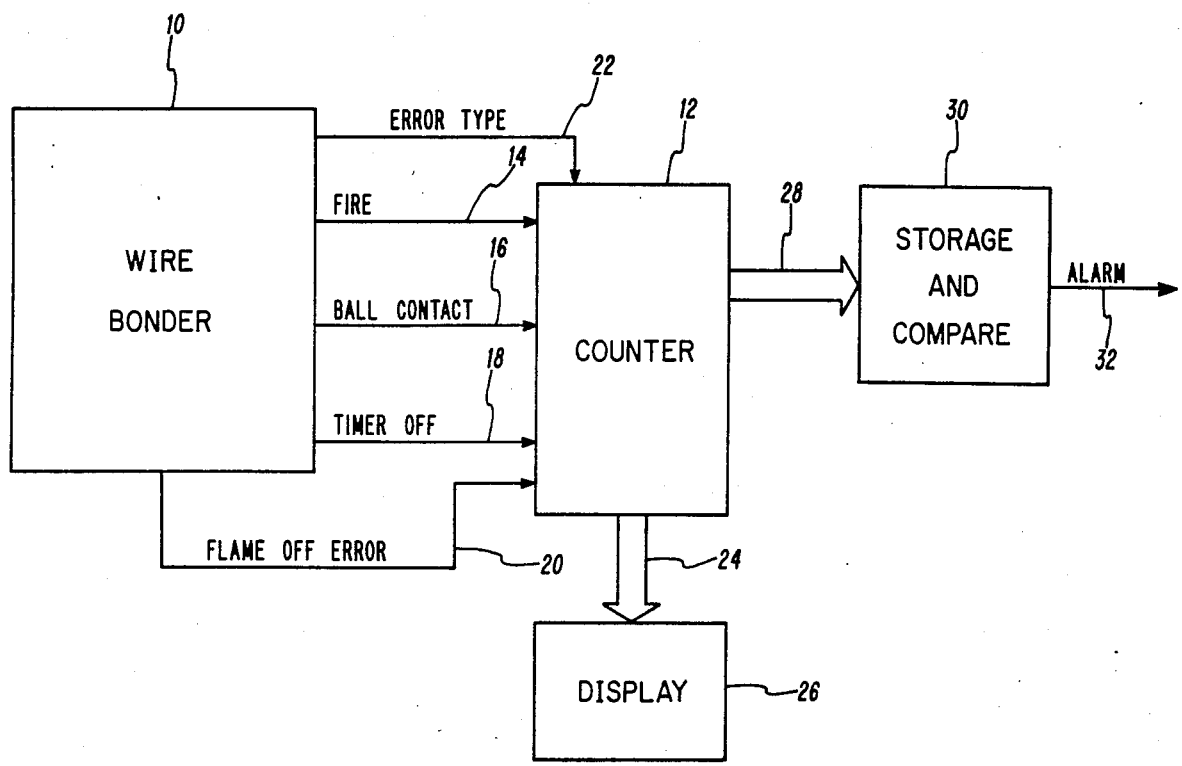
FIG. 1 is a block diagram of the overall inventive device.

In FIG. 1, an electronic flame-off type ball wire bonder is illustrated as block 10 having a plurality of outputs supplied to a counter 12. A lead 14 provides a "fire" indication when an arc is struck between a bonding wire extending from a capillary and the flame-off electrode (EFO wand). A lead 16 provides a "ball contact" pulse when the ball being formed makes contact with the capillary type holder. A lead 18 provides a "timer off" indication when the arc has been terminated by a timer and a lead 20 provides a "flame-off error" indication that there was a problem in striking the arc while a lead 22 provides an "error type" indication of the error. In other words, lead 22 is a logic 0 or a logic 1 depending upon whether the arc was never struck or that a short has occurred between the wire and the EFO wand. The later condition occurs when the wire is considerably too long.

A plurality of leads 24 supplies parallel data to a display 26 and a similar plurality of leads 28 provides information to a storage and compare block 30 which has an alarm output 32.

Figure 2:
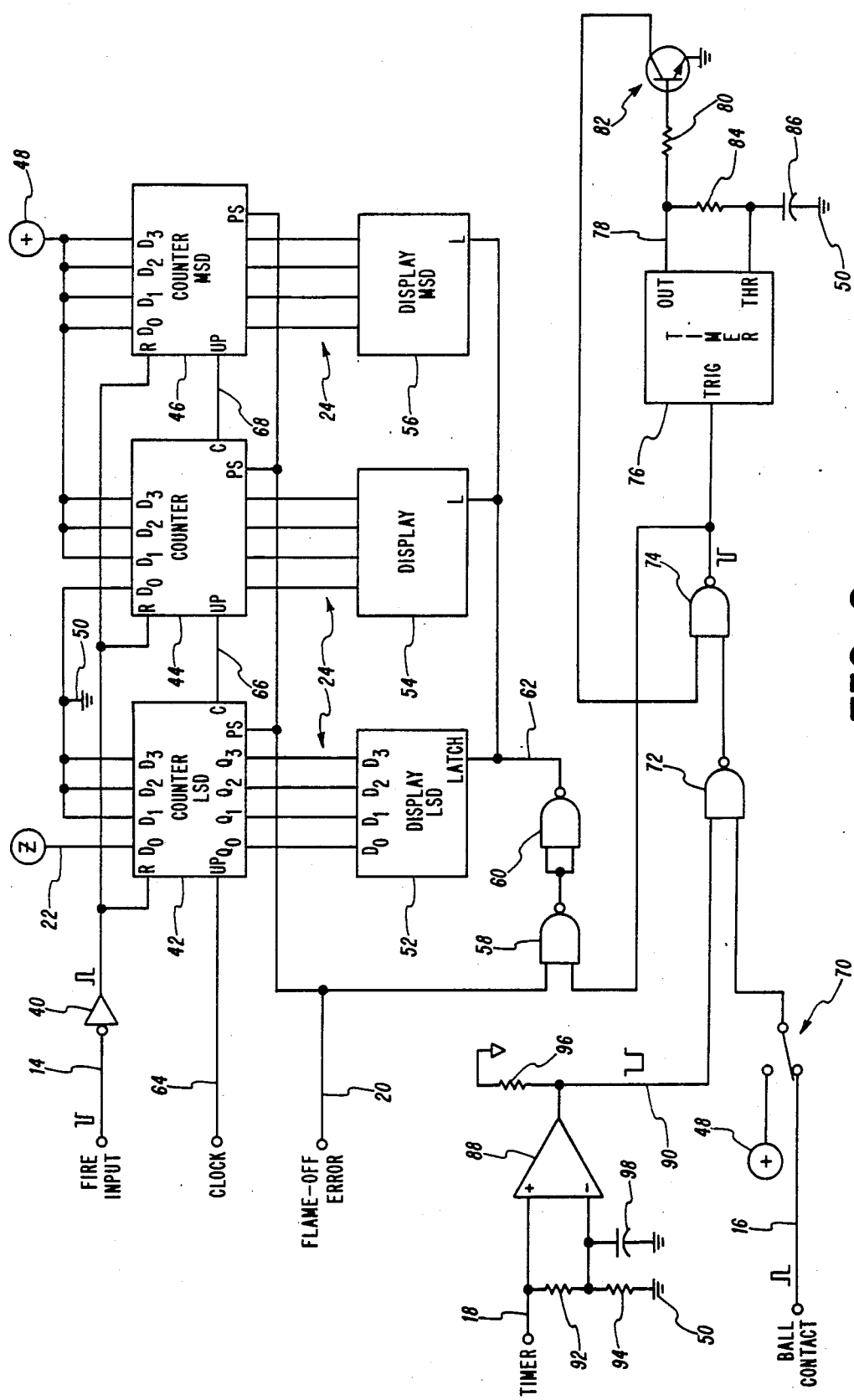
FIG. 2 is a block schematic diagram showing in more detail portions of FIG. 1.

The apparatus of FIG. 2 illustrates details within the counter block 12 and display block 26 of FIG. 1. The various input leads of FIG. 1 are given similar designations for comparable portions of FIG. 2. Thus, a lead 14 providing a "fire" indication or initiation of an arc voltage is supplied through an inverter 40 to a reset input of each of blocks 42, 44 and 6. The three blocks 42 through 46 may be typical counter blocks such as those made by National Semiconductor or Texas Instruments with block 46 being a 74 LS 193 and providing the most significant digit. The other two blocks 42 and 44 in one embodiment of the invention were of a type designated 74 LS 92. The primary difference between the blocks being that block 46 is a binary counter and blocks 42 and 44 are decade counters. Each of these counters has a preset inputs D0 through D3 with all of these inputs on block 46 being connected to a positive supply voltage 48 and leads D1 through D3 of counter 44 being connected to this same potential 48. Input D0 of block 44 and inputs D1 through D3 of block 42 are connected to ground 50. Input D0 of block 42 is connected to the error type lead 22. Each of these D inputs form a preset input so that when a signal is applied on a preset input lead input designated PS in each of blocks 42 through 46, the values prescribed on inputs D0 through D3 are parallel loaded into the counter for transfer to a plurality of hex display blocks 52, 54 and 56. These hex display blocks may be of the type as sold by Hewlett-Packard under designation 5082-7340. These display blocks use LEDs for their display and include an integral latch, decoder and driver. The signals are loaded into the blocks 52 through 56 via the leads generally designated as 24 from the Q0 through Q3 outputs on each of blocks 42 through 46. The input lead 20 is connected not only to the preset inputs PS of blocks 42 through 46 but also to one input of a NAND gate 58. An output of NAND gate 58 is supplied to a further NAND gate which is configured to operate as an inverter 60 which then supplies signals on a lead 62 to latch inputs of each of the LEDs' displays 52 through 56. As will correspond with the counters, the most significant bit of the hex display is block 56. A clock signal is supplied on a lead 64 to an input of block 42 and a carry output of this block is supplied on a further lead 66 to a similar clock input of block 44. Finally, a lead 68 supplies further count or carry outputs from block 44 to block 46. The lead 16 is provided to a switch generally designated as 70 which switches between the lead 16 and a positive potential 48. The switchable lead of switch 70 is connected to one input of a NAND gate 72 whose output is connected to a further NAND gate 74. An output of NAND gate 74 is supplied as a second input to NAND gate 50 as well as to a trigger input of a timer block 76. Timer block 76 provides an output on a lead 78 through a resistor 80 to a transistor generally designated as 82. A collector output of transistor 82 is supplied back as a second input to NAND gate 74. A resistor 84 is connected in series with a resistor 86 between lead 78 and ground 50. A junction between resistor 84 and capacitor 86 is connected to a threshold input (THR) of timer 76. The timer may be a 555 timer commonly available in the industry. The timer 76 disables any outputs from NAND gate 74 for approximately four times the period of the flame-off arc voltage so that other signals such as the timer signal cannot accidentally trigger the display when trying to measure actual tail length while the wire bonder 10 is not limiting at ball contact. The timer lead 18 is supplied through a negative edge triggered pulse forming amplifier 88 to a lead 90 providing a second input to NAND gate 72. Associated with amplifier 88 are three resistors 92, 94 and 96 connected as shown with a capacitor 98 connected in parallel with resistor 94.

Figure 3:
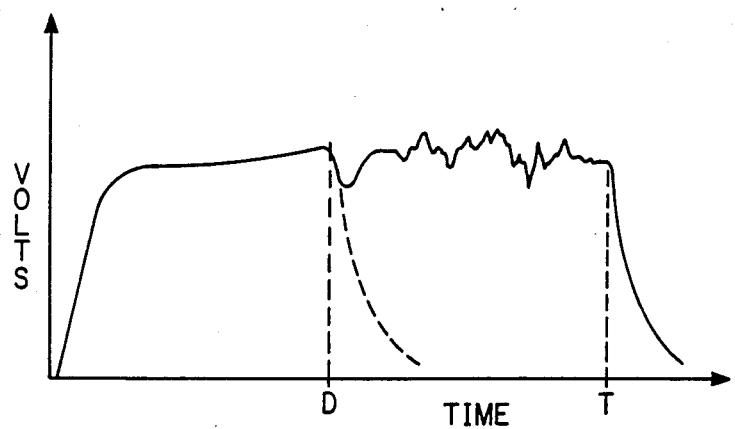
FIG. 3 is a waveform showing the means by which detection of the time of contact is performed to produce the signals used in accomplishing the present inventive concept.

In FIG. 3 a presentation is provided representing the applied arc voltage with time where the arc voltage rises very rapidly as long as conditions are normal to a relatively unchanging value. It stays at this reasonably unchanging value until contact is made between the ball formed and the capillary tip. This is shown as time D in FIG. 3. The arc voltage provides a sudden dip which actuates a detection device which is the subject of the referenced co-pending application to provide the output signal used by the present invention on lead 16. If a timer is used to provide an excess time of application of the arc rather than termination by the contact detector, the arc voltage causes sputtering and oscillations of the voltage as shown until time T where the timer terminates the application of the arc voltage. Lead 18 may provide an indication of the total elapsed time of the arc voltage or may merely provide a pulse indicating the cessation of the voltage at time T.

OPERATION

When the wire bonder is ready to form a ball on the wire which is extending from a capillary tip, an arc voltage applied causes a signal to be supplied on lead 14 to counter 12. Counter 12, at this time, resets the count to 0 and commences counting. When contact is made between the ball and the capillary tip, an output signal is provided on lead 16. If the switch 70 of FIG. 2 is turned to the position shown, the pulse is passed through NAND gates 72, 74, 58 and 60 to supply a latch signal to the displays 52 through 56. The count output by counter elements 42 through 46 will be parallel loaded into the display and the count will be displayed. If switch 70 is in the other possible condition, the signal on lead 16 will not be passed to NAND gate 72. Rather, nothing further will happen until the end of timing operation is indicated on lead 18 where a pulse shown on lead 90 will be used to actuate the latch of the display counters by passing through the previously stated NAND gates 72, 74, 58 and 60.

As previously indicated, the length of the wire determines the length of time before the ball being formed contacts the capillary. Thus, if the leads are normally a given length and something changes either in the quality of the wire or to cause the wire extending from the capillary tip to be either much shorter or much longer than previously, this changed time will be displayed on display 26. A block such as block 30 may be used to store either the previous count or an average of previous counts and compare the stored information with the present count and provide an alarm on lead 32 if there is a deviation by more than a prescribed percentage.

If the arc voltage rises very high indicating that there is no tail at all, an output signal will be provided on lead 20 and a given logic value will be supplied on lead 22. This signal on lead 20 will actuate the preset input of the various counters so that the most significant bit will display an F and the display 54 will display an E with the display 52 indicating either a logic 0 or a logic 1. Thus, when an FE indication is provided, there is a flame-off error being indicated. The logic 0 or logic 1 error bit is used to provide an indication as to whether the error was due to a high voltage no wire condition or a very low voltage shorted condition.

In summary, the present invention may provide an indication of actual tail length or ball size in a process control or troubleshooting mode to signify variations in quality of the previous bond, the bond surface, the wire and the wire clamp action. It can also be used as a continuous check of tail length to produce an alarm if there is a significant deviation from previous tail lengths. Further, it can be used to indicate the type of failure such as a short or an open condition from a much too long tail length and a no tail condition respectively.

Although a single embodiment of the inventive concept has been illustrated using specific circuit components, it is to be realized that the inventive concept can be designed using many various components and approaches and I wish to be limited not by the specific embodiment illustrated but only by the scope of the appended claims wherein

I claim:

1. The method of time checking the operation of electronic flame-off apparatus comprising the steps of:
   applying a high voltage arc to a bonding wire extending from a capillary tip of a wire bonding means;
   monitoring the voltage slope of the applied voltage arc;
   terminating the application of the high voltage arc when a negative slope is detected;
   detecting the time between the steps of applying and terminating the high voltage arc and;
   outputting an indication of the detected time whereby the quality of bonds made by the apparatus can be ascertained.

2. Apparatus for monitoring the operation of electronic flame-off apparatus comprising, in combination:
   first means for supplying a signal indicative of the beginning of a high voltage arc to a bonding wire extending from a capillary tip of a wire bonding means;
   second means for supplying a signal indicative of the occurrence of a formed ball contacting said capillary tip; and
   counting third means, connected to said first and second means, for outputting an output signal indicative of the time between receipt of signals whereby variations in the value of said output signal are indicative of the quality of bonds obtained by the electronic flame-off apparatus.

3. Apparatus as claimed in claim 2 comprising in addition;
   fourth means for supplying a signal indicative of an arc timer device incorporated within the electronic flame-off apparatus; and
   switch fifth means, comprising a part of said third means, for receiving the signals supplied by said second and fourth means and selectively using one of the received signals in generating said output signal.

4. Apparatus for use with electronic flame-off equipment having output signals (1) indicative of application of a high voltage ball forming arc signal to a bonding wire extending from a capillary type bonding tip and (2) indicative of contact of the ball being formed with the capillary tip comprising, in combination:
   input first means for receiving a first signal indicative of the application of a high voltage ball forming arc;
   input second means for receiving a second signal indicative of formed ball contact;
   counter third means, including reset input means and count output means, connected to said first means whereby receipt of said first signal causes said third means to be momentarily reset to a given value; and
   display fourth means, including latch input means and count input means, connected to said second and third means for storing a count output by said third means to be displayed at the time of receipt of said second signal.

5. Apparatus for use with electronic flame-off equipment having output signals (1) indicative of application of a high voltage ball forming arc signal to a bonding wire extending from a capillary type bonding tip, (2) indicative of contact of the ball being formed with the capillary tip, (3) indicative of the occurrence of a flame-off error and (4) indicative of the type of flame-off error comprising, in combination:
   input first means for receiving a first signal indicative of the application of a high voltage ball forming arc;
   input second means for receiving a second signal indicative of capillary tip ball contact;
   input third means for receiving a third signal indicative of the occurrence of a flame-off error;
   input fourth means for receiving a fourth signal indicative of the type of flame-off error;
   counter fifth means, including reset input means, preset count value input means, preset input signal means and count output means, connected to said first means, third means and fourth means whereby receipt of said first signal causes said fifth means to be momentarily reset to a first given value and receipt of said third signal causes said fifth means to be momentarily preset to a second given value in accordance with said fourth signal;
   logic sixth means, connected to said second and third means, for supplying an output fifth signal indicative of the occurrence of either of said second or third signals; and display seventh means, including latch input means and count input means, connected to said fifth and sixth means for storing a count output by said fifth means to be displayed at the time of receipt of said fifth signal at said latch input means.

6. Apparatus for use with electronic flame-off equipment having output signals (1) indicative of application of a high voltage ball forming arc signal to a bonding wire extending from a capillary type bonding tip, (2) indicative of contact of the ball being formed with the capillary tip and (3) indicative of arc signal timer termination to provide either an indication of tail length or arc voltage application time comprising, in combination:

input first means for receiving a first signal indicative of the application of a high voltage ball forming arc;

input second means for receiving a second signal indicative of contact of the ball being formed with the capillary tip;

input third means for receiving a third signal indicative termination of the high voltage arc timing signal;

counter fourth means, including reset input means and count output means, connected to said first means whereby receipt of said first signal causes said fourth means to be momentarily reset to a given value;

exclusive logic fifth means, connected to said second and third means, for supplying an output fourth signal indicative of the occurrence of only one of said second and third signals; and display sixth means, including latch input means and count input means, connected to said fourth and fifth means for storing a count output by said fifth means to be displayed at the time of receipt of said fourth signal at said latch input means.

* * * * *